(12) United States Patent
Lee et al.

(10) Patent No.: US 6,392,885 B1
(45) Date of Patent: May 21, 2002

(54) FAN HOLDER

(75) Inventors: Dongyun Lee; Hsieh Kun Lee, both of Shenzhen (CN)

(73) Assignee: Foxconn Precision Components Co., Ltd., Taipiei Hsien (TW)

( * ) Notice: Subject to any disclaimer, the term of this patent is extended or adjusted under 35 U.S.C. 154(b) by 0 days.

(21) Appl. No.: 09/827,090

(22) Filed: Apr. 5, 2001

(30) Foreign Application Priority Data

Mar. 13, 2001 (TW) ...................................... 90203722 U

(51) Int. Cl.[7] ................................................. H05K 7/20
(52) U.S. Cl. ........................ 361/697; 361/695; 361/704; 257/718; 257/719; 257/722; 257/727; 174/16.3; 165/80.3; 165/185; 24/458
(58) Field of Search ........................ 361/690, 695–697, 361/704, 707, 709–711, 715–718; 24/457, 458; 174/16.3; 165/80.3, 122, 185; 257/706, 707, 718, 719, 727

(56) References Cited

U.S. PATENT DOCUMENTS

| | | | | |
|---|---|---|---|---|
| 5,495,392 A | * | 2/1996 | Shen | 361/697 |
| 5,615,998 A | * | 4/1997 | Kodama et al. | 415/177 |
| 5,677,829 A | * | 10/1997 | Clemens | 361/697 |
| 5,724,228 A | * | 3/1998 | Lee | 361/697 |
| 6,017,185 A | * | 1/2000 | Kuo | 415/177 |
| 6,118,687 A | * | 9/2000 | Clemens | 361/697 |

* cited by examiner

*Primary Examiner*—Leo P. Picard
*Assistant Examiner*—Boris L. Chervinsky
(74) *Attorney, Agent, or Firm*—Wei Te Chung

(57) ABSTRACT

A fan holder (10) for attaching a fan (30) to a heat sink (40) includes a base (11) defining a vent (24) for allowing air flow, two pairs of legs (16, 18), two pairs of posts (14) around the vent and a pair of positioning blocks (22). The legs depend from the base, and each leg has a hook (166, 186) for engaging with the heat sink. A pair of slots (20) is defined in the base on opposite sides of each leg. A pair of handles (188) extends upwardly from one pair of legs, for facilitating operation of the holder. The posts extend upwardly from the base, for being received in corresponding holes (32) of the fan. Each post has a resilient tab (142), for resiliently and firmly attaching the fan on the holder. The positioning blocks are formed under the base, on opposite sides of the vent.

11 Claims, 5 Drawing Sheets

FAN HOLDER

BACKGROUND OF THE INVENTION

1. Field of the Invention

The present invention relates to a holder, and particularly to a fan holder for attaching a fan to a heat sink.

2. Description of Related Art

Computer electronic devices such as central processing units (CPUs) generate a lot of heat during normal operation. This can deteriorate their operational stability and damage associated electronic equipment. Thus the heat must be removed quickly to ensure normal operation. A heat dissipation device is often attached to a top surface of a CPU, to remove heat therefrom.

Referring to FIG. 5, a conventional heat dissipation device 100 comprises a heat sink 120 and a fan 140. The fan 140 is secured on the heat sink 120 by screws 160 engaging with threads defined in fins 122 of the heat sink 120. Spaces between the adjacent fins 122 which accommodate the screws 160 are required to be larger than other spaces between other adjacent fins 122. Thus all the spaces between adjacent fins 122 are not uniform. This makes manufacturing of the heat sink 120 more complicated.

Furthermore, contemporary CPUs generate unprecedented amounts of heat, which has resulted in large height-to-width ratios of fins of modem heat sinks. The fins of such heat sinks are thin. Thus, in assembly, the fins 122 of the heat dissipation device 100 are prone to deform. Later, during normal operation of the heat dissipation device 100, the screws 160 are liable to gradually disengage from the fins 122.

Moreover, during securing of the screws 160 with the fins 122 of the heat sink 120, fragments are often torn away from the fins 122. The fragments are deposited in the spaces between adjacent fins 122, thereby decreasing the efficiency of heat dissipation.

Examples of conventional heat dissipation devices are disclosed in Taiwan Patent Applications Nos. 85207163 and 86216714.

SUMMARY OF THE INVENTION

Accordingly, an object of the present invention is to provide a fan holder which can securely attach a fan to a heat sink.

Another object of the present invention is to provide a fan holder which can readily attach a fan to a heat sink.

In order to achieve the above-mentioned objects, a fan holder for attaching a fan to a heat sink in accordance with the present invention comprises a base defining a vent for allowing air flow, two pairs of legs, two pairs of posts around the vent and a pair of positioning blocks. The legs depend from the base, and each leg has a hook for engaging with the heat sink. A pair of handles extends upwardly from one pair of legs, for facilitating disassembly of the holder. A pair of slots is defined in the base on opposite sides of each leg, for facilitating deformation of the leg. The posts extend upwardly from the base, for being received in corresponding holes of the fan. Each post has a resilient tab and a notch. The tabs elastically deform and firmly attach the fan on the fan holder. The positioning blocks are formed under the base, on opposite sides of the vent and perpendicular to the hooks.

Other objects, advantages and novel features of the invention will become more apparent from the following detailed description of the preferred embodiments when taken in conjunction with the accompanying drawings.

DETAILED DESCRIPTION OF THE PREFERRED EMBODIMENTS

Figure 1:
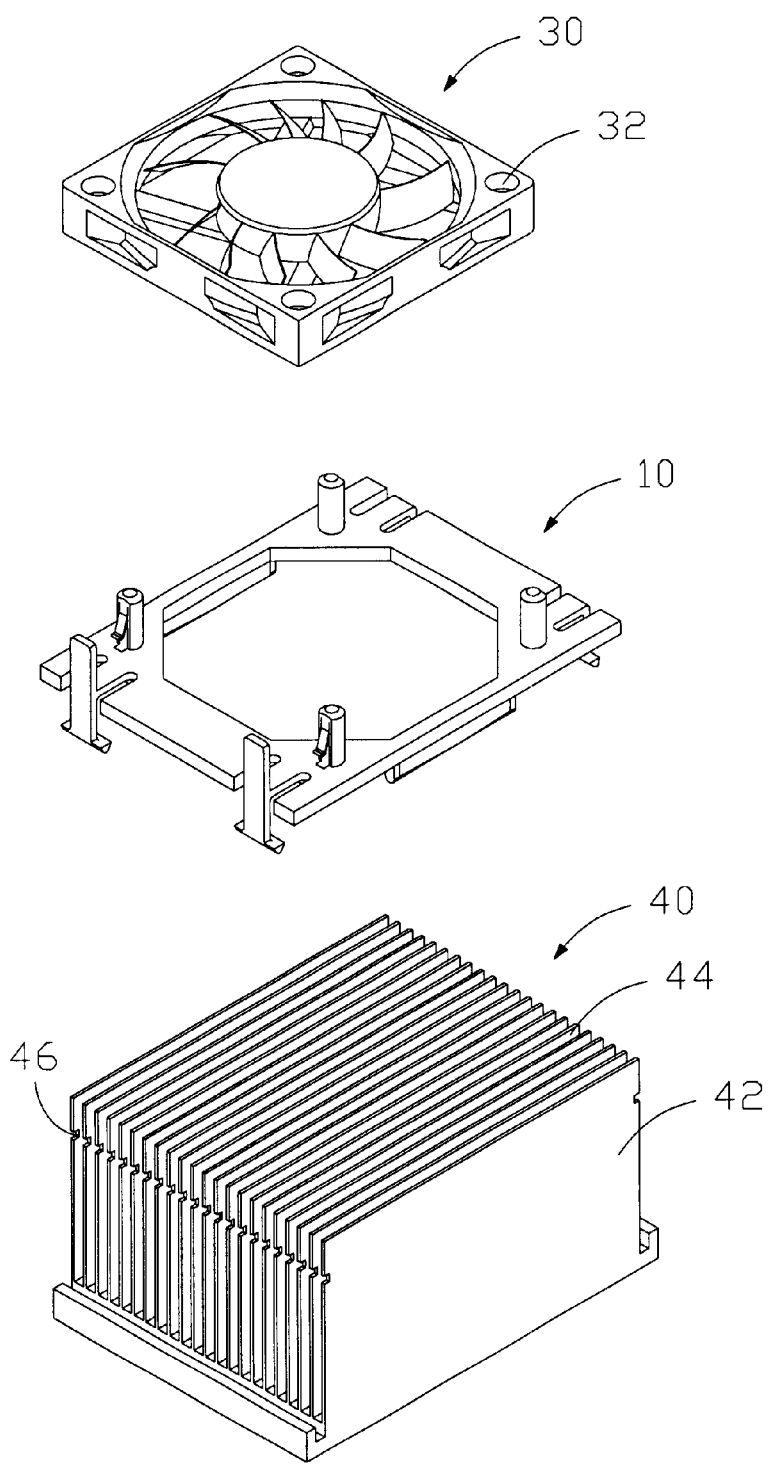
FIG. 1 is an exploded view of a fan holder of a preferred embodiment of the present invention, for securing a fan to a heat sink.

Reference will now be made to the drawing figures to describe the preferred embodiments of the present invention in detail.

FIG. 1 shows a fan holder 10 of the present invention, together with a fan 30 and a heat sink 40.

The fan 30 defines four holes 32 in four corners thereof respectively. The heat sink 40 has a plurality of upwardly extending fins 42, with spaces 44 defined between adjacent fins 42. A pair of grooves 46 is defined through ends of upper portions of the fins 42, the grooves 46 being disposed at opposite sides of the heat sink 40.

Figure 2:
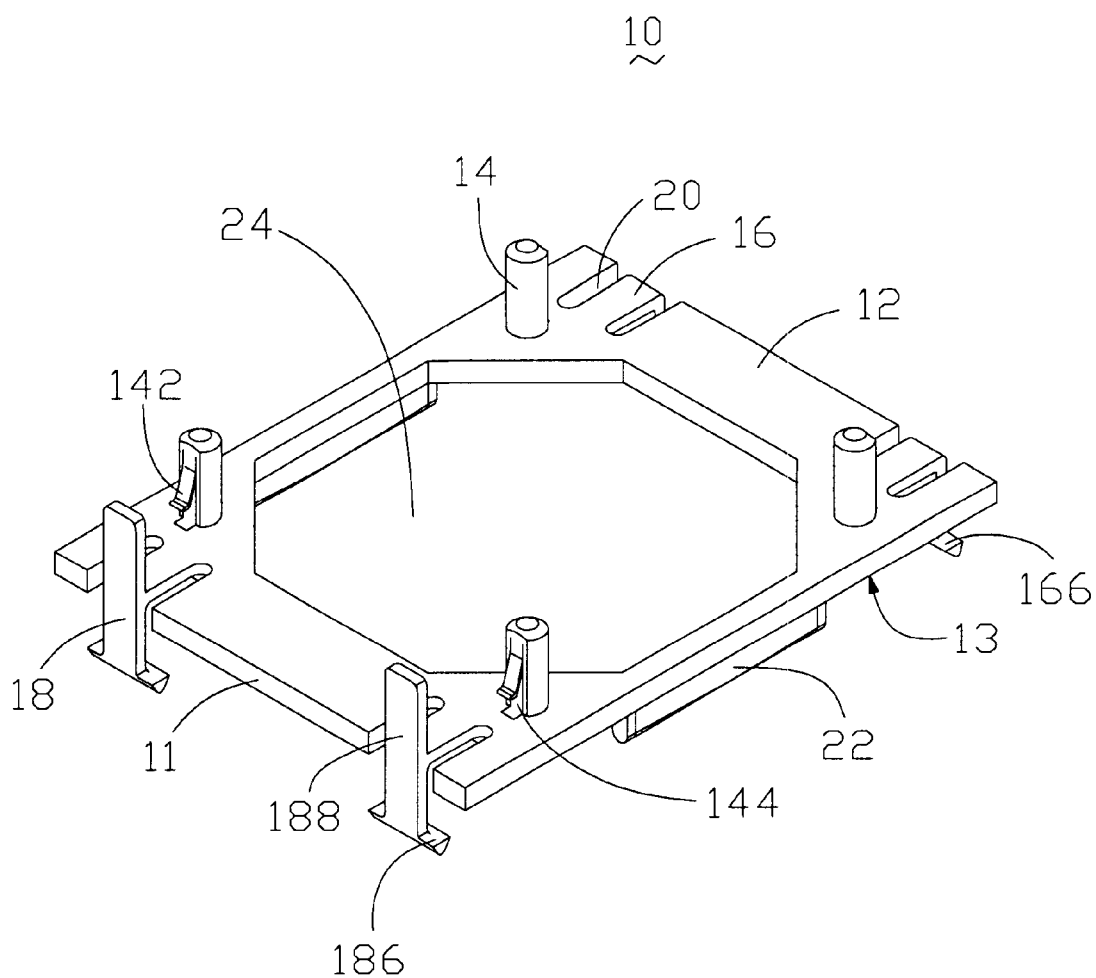
FIG. 2 is a perspective view of the fan holder of FIG. 1.

Referring also to FIG. 2, the fan holder 10 comprises a rectangular base 11, two pairs of posts 14, a pair of first legs 16, a pair of second legs 18 and a pair of elongate positioning blocks 22. The base 11 has a top surface 12, and a bottom surface 13 opposite to the top surface 12. The posts 14 extend upwardly from the top surface 12. Each post 14 is near a respective corner of the base 11, and corresponds to a respective hole 32 of the fan 30. Each post 14 has a resilient tab 142 extending downwardly and outwardly from an upper portion thereof. A notch 144 is defined in each post 14 opposite the tab 142, for facilitating elastic movement of the tab 142.

The two pairs of opposing first and second legs 16, 18 respectively depend from opposite side edges of the base 11. Four pairs of slots 20 are respectively defined in the base 11. Each pair of slots 20 is disposed at opposite sides of a corresponding leg 16, 18, for facilitating elastic movement of such leg 16, 18. Each leg 16, 18 has a hook 166, 186 at a bottom free end thereof. A pair of handles 188 extends upwardly from the second legs 18 respectively, from junctions of the second legs 18 and one side of the base 11. The positioning blocks 22 are respectively formed on opposite sides of the bottom surface 13 of the base 11. The positioning blocks 22 are generally perpendicular to the legs 16, 18. A vent 24 is defined in a center of the base 11, for allowing air flow. The vent 24 is surrounded by the posts 14 and disposed between the positioning blocks 22.

Figure 3:
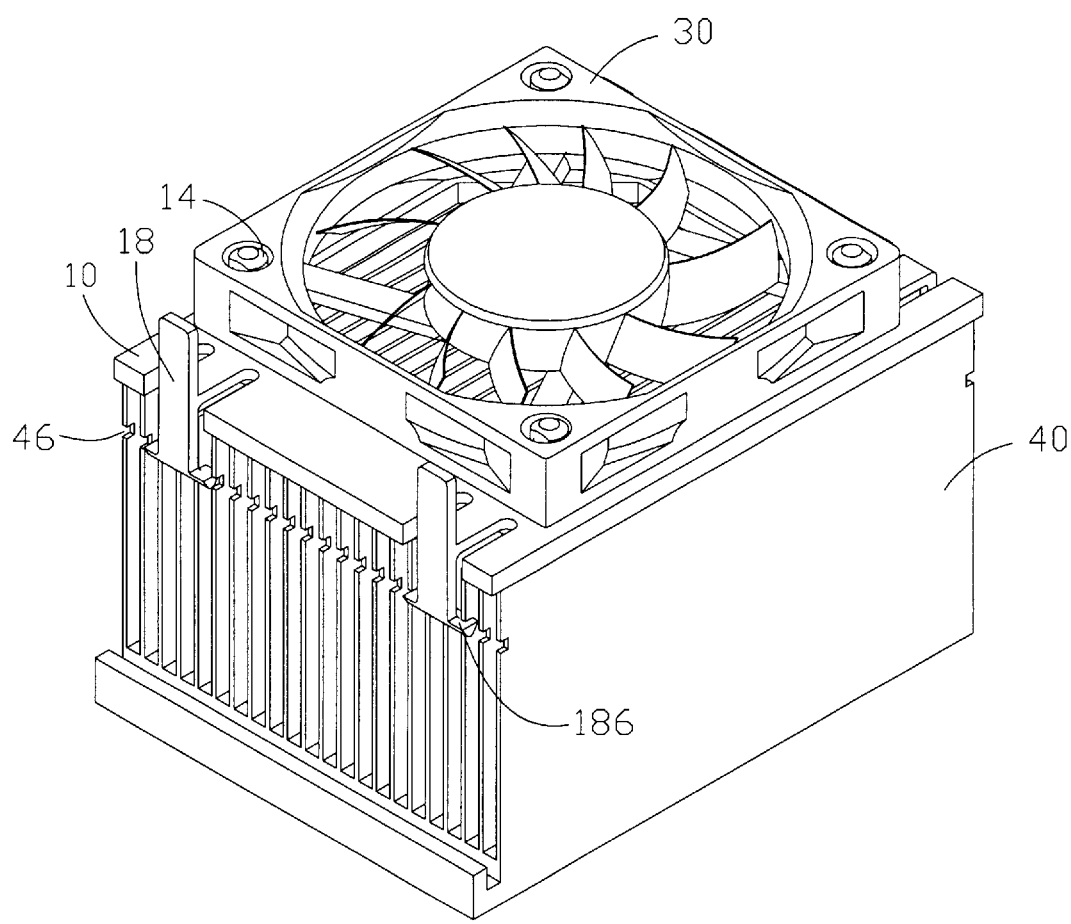
FIG. 3 is an assembled view of FIG. 1.

Referring also to FIG. 3, in assembly, the fan holder 10 is placed on the heat sink 40. The positioning blocks 22 of the fan holder 10 are located above two outmost spaces 44 of the heat sink 40 respectively. The fan holder 10 is pressed downwardly until the hooks 166, 186 thereof snappingly engage in the grooves 46 of the heat sink 40. The positioning blocks 22 are received in the outmost spaces 44, with opposite lateral sides of each positioning block 22 abutting against adjacent fins 42 of the heat sink 44. The fan 30 is then placed on the fan holder 10, with the holes 32 of the fan 30 receiving the posts 14 of the fan holder 10. The fan 30 is pressed downwardly until it contacts the top surface 12 of the fan holder 10. The tabs 142 of the posts 14 elastically deform and tightly abut against the fan 30 in the holes 32, thereby firmly attaching the fan 30 on the fan holder 10. Thus the fan holder 10 readily attaches the fan 30 on the heat sink 40.

In disassembly, the fan 30 is detached from the fan holder 10. The handles 188 are pressed inwardly and downwardly. This causes the hooks 186 on one side of the fan holder 10 to disengage from the corresponding groove 46 of the heat sink 40. Thereupon the fan holder 10 is easily detached from the heat sink 40.

Figure 4:
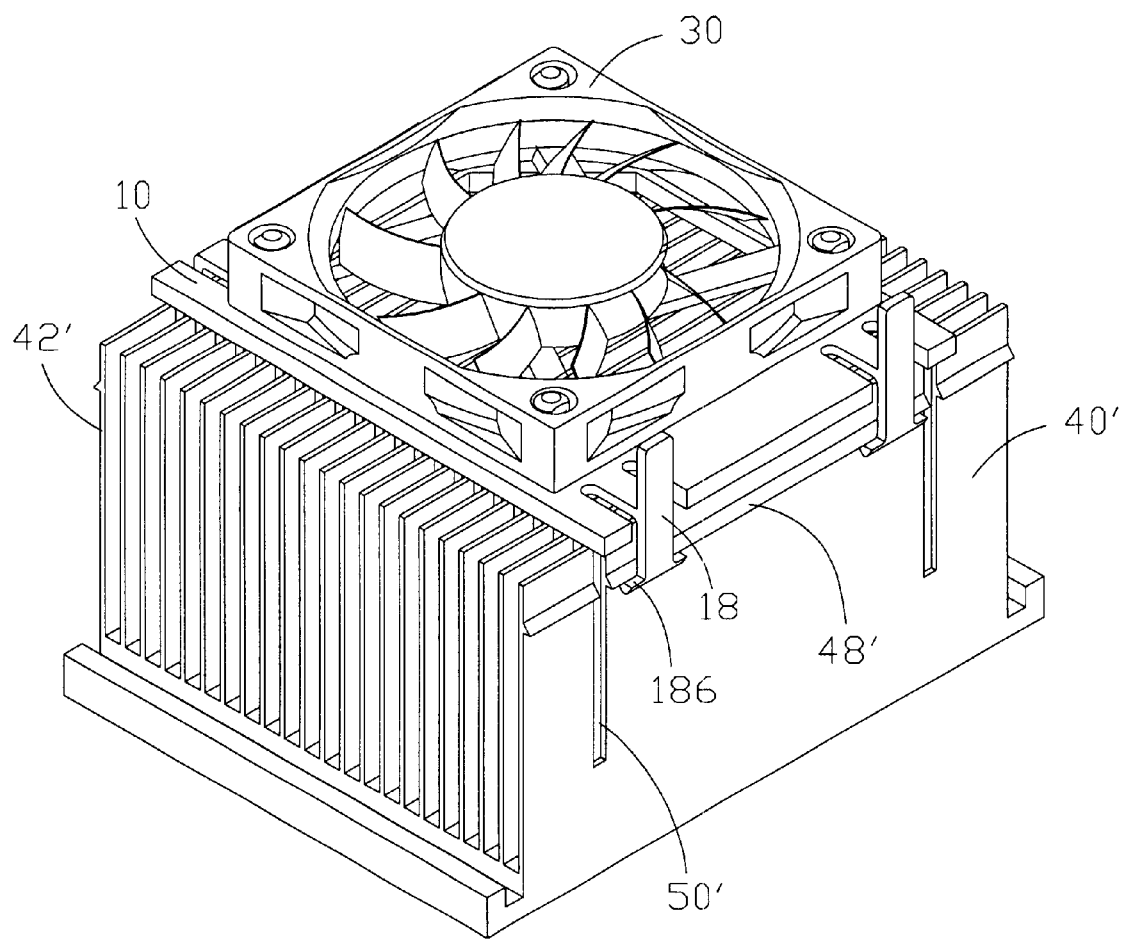
FIG. 4 is similar to FIG. 3, but showing an alternative heat sink.
Figure 5:
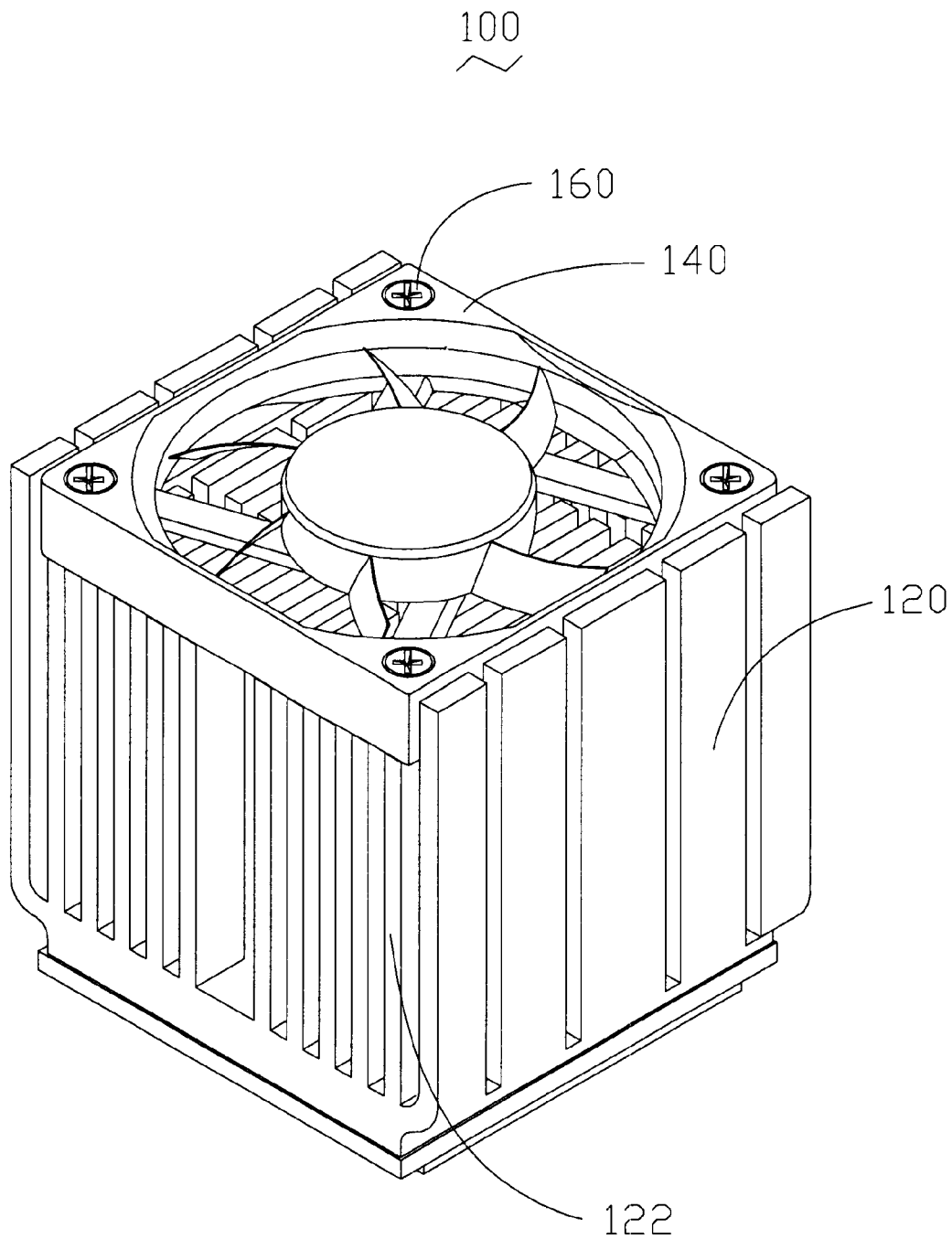
FIG. 5 is an assembled view of a fan attached to a heat sink by a conventional fan holder.

FIG. 4 shows the fan holder 10 of the present invention securing the fan 30 to an alternative heat sink 40'. The heat sink 40' has a plurality of upwardly extending fins 42'. A pair of projections 48' is respectively formed on upper portions of two outmost fins 42', for engaging with corresponding hooks 166, 186 of the fan holder 10. A pair of channels 50' is defined through the fins 42 on opposite sides of the heat sink 40', for receiving corresponding positioning blocks 22 of the fan holder 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan holder for attaching a fan to a heat sink, comprising:

a base defining a vent for allowing airflow, e base having a top surface and a bottom surface;

a plurality of post extending from the top surface of the base, each post having a resilient tab adapted for resiliently engaging with the fan;

a plurality of legs formed on the bottom surface of the base for engaging with the heat sink and thereby attaching the fan to the heat sink, and at least one handle extending from at least one of the legs for facilitating operation of the at least one leg;

wherein the handle is located above the top surface of the base.

2. The fan holder as claimed in claim 1, wherein a pair of slots is defined in the base on opposite sides of each leg for facilitating deformation of the leg.

3. The fan holder as claimed in claim 1, wherein at least one positioning block is formed on the bottom surface of the base.

4. The fan holder as claimed in claim 1, wherein each post defines a notch opposite a corresponding tab.

5. A heat dissipation device, comprising:

a heat sink with a plurality upwardly extending fins;

a fan with a plurality of holes defined therein; and a holder attaching the fan to the heat sink, the holder comprising:

a base defining a vent for allowing air flow;

a plurality of posts extending from the base into the holes, each post forming a resilient tab extending from an upper portion of the post toward the base, each resilient tab resiliently engaging the fan and thereby fixing the fan to the holder;

a plurality of legs depending from the base toward the heat sink to engage with the fins of the heat sink and whereby fix the holder and the heat sink together; and at least one handle extending from at least one of the legs for facilitating operation of the at least one leg;

wherein the handle is located above the base.

6. The heat dissipation device as claimed in claim 5, wherein each post defines notch opposite the resilient tab.

7. The heat dissipation device as claimed in claim 5, wherein a pair of slots is defined in the base on opposite sides of each leg for facilitating deformation of the leg.

8. The heat dissipation device as claimed in claim 5, wherein at least one positioning block is formed on the base for being received in a space between two adjacent fins of the heat sink and thereby securely fixing the holder and the heat sink together.

9. The heat dissipation device as claimed in claim 5, wherein the fins of the heat sink define a pair of grooves on opposite sides thereof, and each leg of the fan holder has an hook engaging in a corresponding groove.

10. The heat dissipation device as claimed in claim 5, wherein the heat sink forms a pair of projections on two outmost fins thereof, and each leg of the fan holder has a hook engaging with a corresponding projection.

11. The heat dissipation device as claimed in claim 5, wherein the heat sink defines at least one channel, and the fan holder forms at least one positioning block received in the at least one channel, thereby securely fixing the holder and the heat sink together.

* * * * *